United States Patent
Cha et al.

(10) Patent No.: US 8,334,708 B1
(45) Date of Patent: Dec. 18, 2012

(54) SYSTEMS, METHODS, AND APPARATUSES FOR COMPLEMENTARY METAL OXIDE SEMICONDUCTOR (CMOS) DRIVER CIRCUITS USING SHARED-CHARGE RECYCLING CHARGE PUMP STRUCTURES

(75) Inventors: Jeongwon Cha, Duluth, GA (US);
Taejoong Song, Seongnam-si (KR);
Changhyuk Cho, Roswell, GA (US);
Minsik Ahn, Atlanta, GA (US);
Chang-Ho Lee, Marietta, GA (US);
Wangmyong Woo, Cumming, GA (US);
Jae Joon Chang, Duluth, GA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 0 days.

(21) Appl. No.: 13/194,315

(22) Filed: Jul. 29, 2011

(51) Int. Cl.
*H03K 19/00* (2006.01)
*H03K 19/02* (2006.01)

(52) U.S. Cl. .............................. 326/58; 326/56; 326/33

(58) Field of Classification Search .................... None
See application file for complete search history.

(56) References Cited

U.S. PATENT DOCUMENTS

| 7,501,851 B2 * | 3/2009 | Venditti et al. .................. 326/30 |
| 7,948,263 B2 * | 5/2011 | Kim et al. ....................... 326/33 |

* cited by examiner

*Primary Examiner* — Shawki Ismail
*Assistant Examiner* — Crystal L Hammond (57) ABSTRACT

Example driver circuits can utilize shared-charge recycling charge pump structures. In particular, an example shared-charge recycling process may be applied to a clock buffer and charge transfer cells of the charge pump in a driver circuit. An example recycling process may include recycling of shared charges between the capacitors/capacitances in the charge transfer cells. An example recycling process may use the charges in one or more capacitors to charge one or more other capacitors before the charges are wasted or otherwise discharged to ground. Such recycling may significantly reduce the power consumption of the charge pump while still providing a high output voltage level, according to an example embodiment of the invention.

20 Claims, 9 Drawing Sheets

SYSTEMS, METHODS, AND APPARATUSES FOR COMPLEMENTARY METAL OXIDE SEMICONDUCTOR (CMOS) DRIVER CIRCUITS USING SHARED-CHARGE RECYCLING CHARGE PUMP STRUCTURES

FIELD OF THE INVENTION

Aspects of the invention relate generally to driver circuits, and more particularly, to complementary metal-oxide-semiconductor (CMOS) driver circuits using shared-charge recycling pump structures.

BACKGROUND OF THE INVENTION

Due to the increased demand for mobile devices, power consumption has been a major concern in designing integrated circuits, especially for driver circuits to drive antenna switches, liquid crystal displays (LCDs), and memories because these components are integrated in one mobile device to satisfy the customers' demand on functionalities. The integration of these various functional blocks, typically digital blocks, led to the ever-shrinking feature size of a CMOS technology, and the scaling-down resulted in a lower power-supply voltage. However, many driver circuits still need a higher voltage than a given power-supply voltage. In addition, a negative voltage is necessary for many applications, which include memories and antenna switches. To generate the high voltage or the negative voltage, charge pumps have traditionally been used because they are small in size and dissipate relatively small amounts of power. However, the charge pump is still the dominant power consumer in the driver circuits.

Many techniques have been introduced to reduce the power consumption of the charge pump. Some of the techniques focused on the efficiency of the charge pumping mechanism. Other techniques introduced new clocking schemes, such as a four-phase clocking scheme, which uses four different phases of a clock signal instead of two out-of-phase clock signals, to improve the efficiency of the charge pump. However, these techniques aimed to improve the efficiency of the charge transfer cells with already-given clock signals. The efficiency of the clock generation blocks has been overlooked.

Prior art charge pump circuits with CMOS-inverter clock buffers draw a significant amount of power to drive the capacitors in the charge transfer cells. The power consumed to generate the clock signals is a dominant factor in the total power consumption of the charge pump, and it becomes more critical when the charge transfer cells utilize larger capacitors or the number of charge transfer cells is increased to make higher output voltages.

Thus, there is an opportunity in the industry for systems, methods, and apparatuses for CMOS driver circuits using shared-charge recycling pump structures.

BRIEF SUMMARY OF THE INVENTION

Embodiments of the invention may provide for CMOS driver circuits that may utilize shared-charge recycling pump structures, according to an example embodiment of the invention. The CMOS driver circuits can be implemented as CMOS antenna-switch drivers, LCD drivers, memory device drivers, or other component drivers. According to an embodiment of the invention, the CMOS driver circuit may be fabricated using a variety of processes, including, but not limited to, a 0.35-μm CMOS process. However, other processes may be utilized without departing from the embodiments of the invention.

In an example embodiment of the invention, an example shared-charge recycling process may be utilized with an antenna-switch driver circuit. More specifically, an example shared-charge recycling process may be applied to a clock buffer and charge transfer cells of the charge pump in the antenna-switch driver circuit. An example recycling process may include recycling of shared charges between the capacitors in the charge transfer cells. In contrast to prior art charge pump circuits with the CMOS-inverter clock buffers where the charges stored in the capacitors of the charge transfer cells are discharged directly to ground and wasted, an example recycling process may use the charges in one or more capacitors to charge one or more other capacitors before the charges are wasted. Such recycling may significantly reduce the power consumption of the charge pump.

Accordingly, an example shared-charge recycling process may provide lower power consumption without sacrificing the output voltage level. As an illustrative example, an antenna-switch driver utilizing an example shared-charge recycling process may achieve a current reduction of 1.6 mA from 4.8 mA to 3.2 mA at the output voltage level of 8.8 V, according to an example embodiment of the invention. In the output voltage range of 7.2 to 9.4 V, the current consumption of an antenna-switch driver may be reduced by 30% to 34%.

According to an example embodiment of the invention, there is a CMOS driver circuit. The CMOS driver circuit may include a first tristate inverter that provides a first clock signal along a first signal path; a second tristate inverter that provides a second clock signal along a second signal path, the first clock signal and the second clock signal being out of phase; at least one first capacitor that receives the first clock signal in the first signal path; at least one second capacitor that receives the second clock signal in the second signal path; a switch configured between the first signal path and the second signal path, wherein the switch is closed to connect the first and second signal paths, and opened to isolate the first and second signal paths, wherein during a stored-charge recycling process, the first and second tristate inverters are disabled and the switch is closed, thereby allowing stored charges to be transferred either (i) from the at least one first capacitor to the at least one second capacitor, or (ii) from the at least one second capacitor to the at least one first capacitor.

According to another example embodiment, there is a method for providing a driver circuit. The method may include providing a first tristate inverter that provides a first clock signal along a first signal path; providing a second tristate inverter that provides a second clock signal along a second signal path, the first clock signal and the second clock signal being out of phase; configuring at least one first capacitor to receive the first clock signal in the first signal path; configuring one second capacitor to receive the second clock signal in the second signal path; providing a switch between the first signal path and the second signal path, wherein the switch is closed to connect the first and second signal paths, and opened to isolate the first and second signal paths, wherein during a stored-charge recycling process, the first and second tristate inverters are disabled and the switch is closed, thereby allowing stored charges to be transferred either (i) from the at least one first capacitor to the at least one second capacitor, or (ii) from the at least one second capacitor to the at least one first capacitor.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

Embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide for CMOS driver circuits that may utilize shared-charge recycling pump structures, according to an example embodiment of the invention. While embodiments of the invention may utilize the CMOS driver circuit as an antenna-switch driver, it will be appreciated that the CMOS driver circuit can also be utilized for driving LCDs, memories, and other components without departing from example embodiments of the invention. An example CMOS driver circuit may operate at a plurality of power-supply voltages, perhaps from 3 V to 4.5 V, which is the typical cellular power-supply voltage range, according to an embodiment of the invention.

In an example embodiment of the invention, an example shared-charge recycling process may be utilized with an antenna-switch driver circuit. More specifically, an example shared-charge recycling process may be applied to a clock buffer and charge transfer cells of the charge pump in the antenna-switch driver circuit. An example recycling process may include recycling of shared charges between the capacitors in the charge transfer cells. An example recycling process may use the charges in one or more capacitors to charge one or more other capacitors before the charges are wasted or otherwise discharged to ground. Such recycling may significantly reduce the power consumption of the charge pump while still providing a high output voltage level, according to an example embodiment of the invention.

Description of Example Driver Circuit

Figure 1:
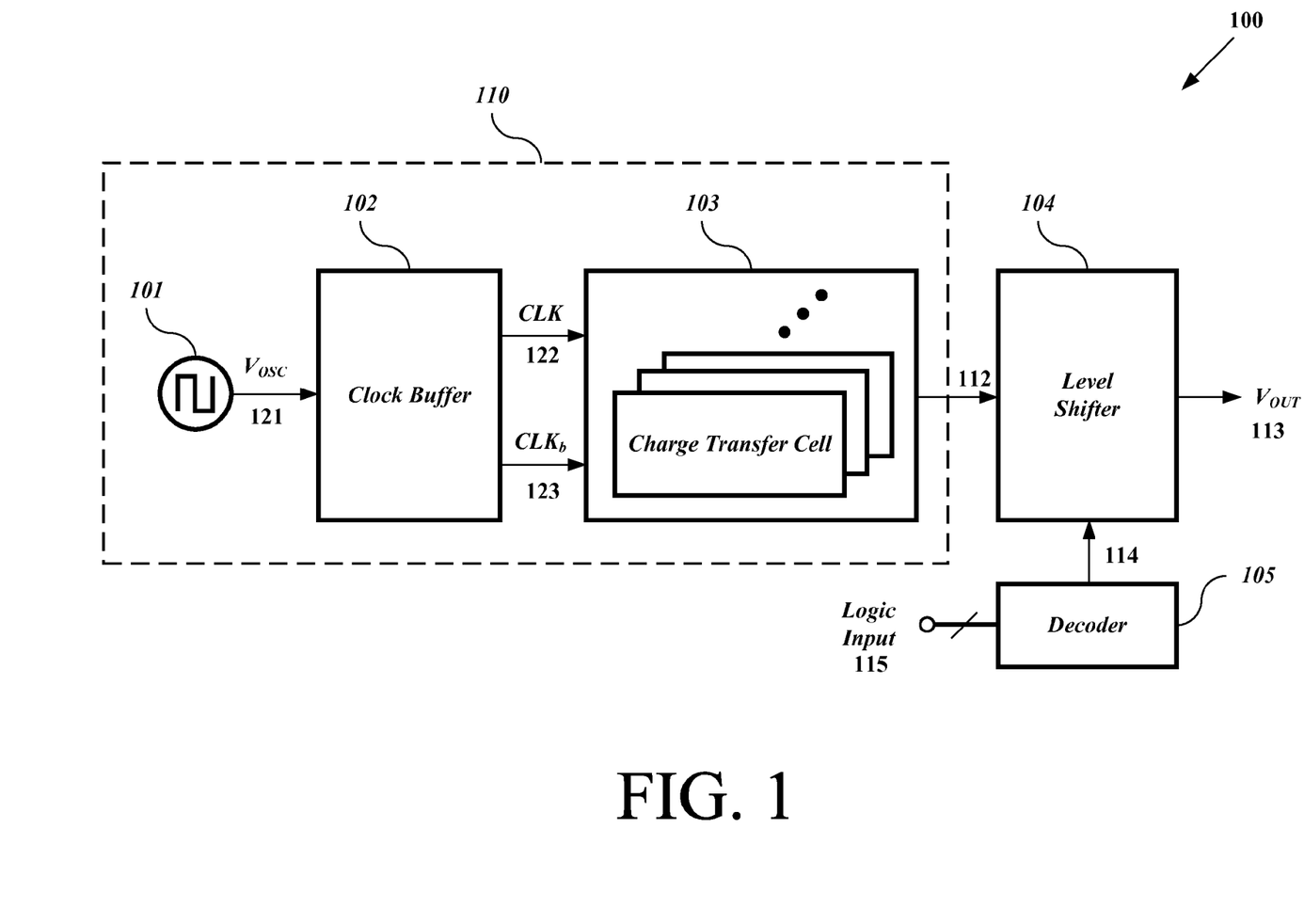
FIG. 1 illustrates an example CMOS driver circuit that utilizes a charge pump to generate a high voltage or negative voltage for use in driving antenna switches or other components in accordance with an embodiment of the invention.

FIG. 1 illustrates an example CMOS driver circuit 100 that utilizes a charge pump 110 to generate a high voltage or negative voltage for use in driving antenna switches or other components in accordance with an embodiment of the invention. As shown in FIG. 1, an example driver circuit 100 may include a charge pump 110, a level shifter 104, and a decoder 105. The charge pump 110 may be operative to generate an output 112 that can be a high voltage and/or a negative voltage, according to an example embodiment of the invention. The output 112 of the charge pump 110 may be delivered to an antenna switch or other component using an example level shifter 104, which may be configured to adjust or convert the output 112 of the charge pump 110 to a desired level for the output voltage 113 (Vout), according to an example embodiment of the invention. The output voltage 113 (Vout) level of the level shifter 104 may be determined by a decoder output 114 (e.g., a control signal), where the decoder 105 may be controlled by logic input 115. As an example, when the decoder output 114 to the level shifter 104 is set to high (e.g., by setting logic input 115 to high or digital "1"), the level shifter 104 may provide an output 113 (Vout) in the form of a high voltage or negative voltage (e.g., based upon output 112), which may be received by an antenna switch or other component. On the other hand, when the decoder output 114 of the decoder 105 is set to low (e.g., by setting logic input 115 to high or digital "0"), the level shifter 104 may provide a low voltage or zero voltage (0V) to the antenna switch or other component, according to an example embodiment. It will be appreciated that the output 113 (Vout) of the driver circuit 100 may not be limited to either the generated output 112 voltage or zero voltage, but can also include any voltages provided to the level shifter 104 such as a power-supply voltage and a voltage generated by a voltage regulator circuit if one exists, according to an example embodiment of the invention.

Still referring to FIG. 1, an example charge pump 110 may comprise an oscillator 101, a clock buffer 102, and charge transfer cells 103. The oscillator 101 may generate a reference clock signal 121 ($V_{OSC}$). The clock buffer 102 may receive a reference clock signal 121 ($V_{OSC}$) and generate out-of-phase clock signals 122 (CLK) and 123 ($CLK_b$). In an example embodiment of the invention, the clock signal 122 (CLK) may be 180 degrees out of phase from the clock signal 123 ($CLK_b$). The out-of-phase clock signals 122, 123 may drive the charge transfer cells 103 to generate the high voltage or the negative voltage. Each charge transfer cell 103 may be comprised of one or more capacitors (e.g., parasitic capacitors) or other charge storage devices, according to an example embodiment of the invention. The charge transfer cells 103 may be connected in series (e.g., cascaded) to increase the output voltage level in magnitude, according to an example embodiment of the invention. The number of charge transfer cells 103 may be determined by the required or desired output voltage level since the voltage gain of each cell may be the same as the amplitude of the clock signals 122, 123, which can be the same as the power-supply voltage, according to an example embodiment of the invention.

It will be appreciated that the example driver circuit 100 is provided by way of example only, and that many variations of FIG. 1 are available in accordance with example embodiments of the invention.

Description of Example Shared-Charge Recycling Process

Figure 2:
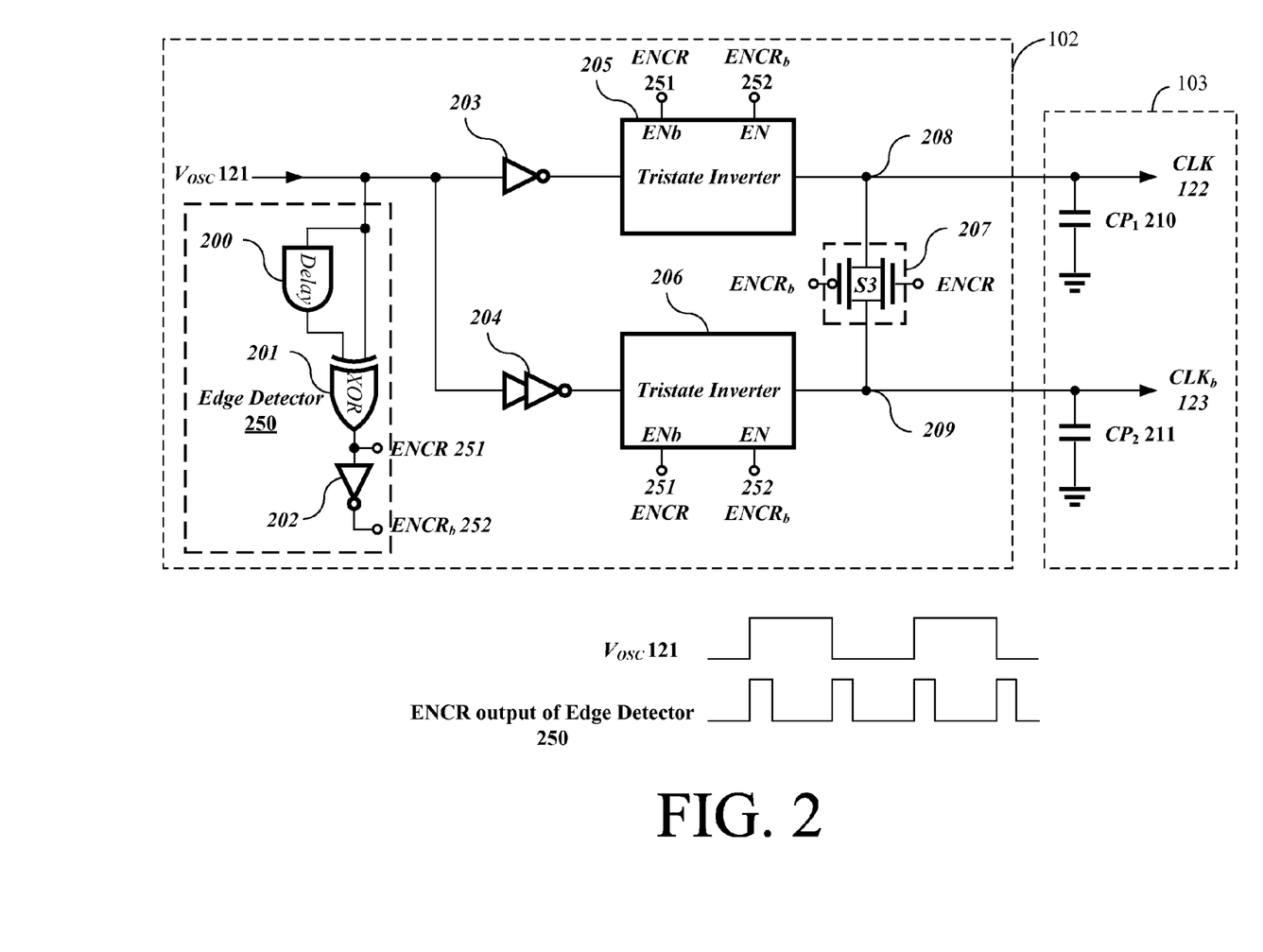
FIG. 2 illustrates an example schematic diagram of an example implementation of an example clock buffer 102 and example charge transfer cells 103, according to an example embodiment of the invention.

FIG. 2 illustrates an example schematic diagram of an example implementation of an example clock buffer 102 and example charge transfer cells 103, according to an example embodiment of the invention. As shown in FIG. 2, an example clock buffer may receive a reference clock signal 121 ($V_{OSC}$) at its input, and output out-of-phase clock signals 122 (CLK) and 123 ($CLK_b$). To generate out-of-phase clock signals 122 (CLK) and 123 ($CLK_b$), the reference clock signal 121 ($V_{osc}$) may be provided to respective first and second signal paths that are configured in parallel, where the first signal path may include an odd number of at least one inverter 203, while the second signal path may include an even number of inverters 204. For example, the inverters 203 may include only a single inverter while the inverters 204 may include two inverters. In the first signal path, the output of the at least one inverter 203 may be provided as an input to a first tristate inverter 205. Similarly, in the second signal path, the output of inverters 204 may be provided as an input to a second tristate inverter 206. The output of each tristate inverter 205, 206 may be an inverse of its respective input when enabled, or high impedance when disabled, according to an example embodiment of the invention. The tristate inverters 205, 206 may be enabled when the respective enable (EN) port is high (logical "1"), and otherwise disabled when the respective enable (EN) port is low (logical "0"). In some example embodiments of the invention, each of the tristate inverters 205, 206 may utilize two complementary enable ports (EN and ENb). In such an embodiment, the tristate inverters 205, 206 may be enabled when the respective first enable (EN) port is high (logical "1") and the second enable port (ENb) is low (logical "0"); likewise, the tristate inverters 205, 206 may be disabled when the respective first enable (EN) port is low (logical "0") and the second enable port (ENb) is high (logical "1"). Some example implementations for the tristate inverters 205, 206 will be described herein with respect to FIGS. 5A-5C and 6A-6C.

The output of the first tristate inverter 205 may provide the first clock signal 122 (CLK) along the first output signal path to charge/discharge at least capacitor 210 ($CP_1$) (e.g., parasitic capacitance of a charge transfer cell) of the charge transfer cells 103. Likewise, the output of the second tristate inverter 206 may provide the second clock signal 123 ($CLK_b$) along the second output signal path to charge/discharge at least capacitor 211 ($CP_2$) (e.g., parasitic capacitance of a charge transfer cell) of the charge transfer cells 103. A transmission-gate switch 207 (S3) may have one end/port connected to a first node 208 of the first output signal path, and a second end/port connected to a second node 209 of the second output signal path. As such, the transmission-gate switch 207 (S3) may be used to either connect or isolate the first and second output signal paths, which resultantly connects or isolates the capacitors 210 ($CP_1$), 211 ($CP_2$) of the charge transfer cells 103, according to an example embodiment of the invention.

The transmission-gate switch 207 (S3) may be formed using a PMOS transistor (e.g., Positive-Channel Metal-Oxide-Semiconductor Field Effect Transistor) connected in parallel with an NMOS transistor (e.g., Negative-Channel Metal-Oxide-Semiconductor Field Effect Transistor) such that the respective sources are connected together, and the respective drains are connected together. The drains may further be connected to node 208 while the sources may be further connected to node 209. The gate of the NMOS transistor may provide a first enable port (EN), which receives the charge-recycling enable signal 251 (ENCR). The gate of the PMOS transistor may provide a second complementary enable port (EN$_b$), which receives the complementary charge-recycling enable signal 252 (ENCRb). As such, the transmission-gate switch 207 (S3) may be enabled when the respective first enable (EN) port is high (logical "1") and the second enable port (ENb) is low (logical "0"); likewise, the transmission-gate switch 207 (S3) may be disabled when the respective first enable (EN) port is low (logical "0") and the second enable port (ENb) is high (logical "1"). When the transmission-gate switch 207 (S3) is enabled, the nodes 208, 209 may be connected, thereby connecting the first and second signal paths (and capacitors 210, 211). On the other hand, when the transmission-gate switch 207 (S3) is disabled, the nodes 208, 209 may be isolated by high impedance, thereby disconnecting the first and second signal paths.

An example edge detector logic circuit 250 may be utilized to generate at least a charge-recycling enable signal 251 (ENCR) that serves as a control signal to control the operations of the tristate inverters 205, 206, as well as the transmission-gate switch 207. In general, at each edge (e.g., rising edge or falling edge) of the reference clock signal 121 ($V_{OSC}$), the edge detector logic circuit 250 may be configured to generate a pulse for the charge-recycling enable signal 251 (ENCR). To do so, the edge detector logic circuit 250 may include an exclusive OR (XOR) logic circuit 201 that receives the reference clock signal 121 ($V_{OSC}$), and a delayed reference clock signal 121, where an amount of the delay is determined by a delay module 200. The output of the XOR logic circuit 201 may provide the charge-recycling enable signal 251 (ENCR). Where complementary charge-recycling enable signals are utilized, then a second charge-recycling enable signal 252 may be obtained by inverting the charge-recycling enable signal 251 using an inverter 202, according to an example embodiment of the invention. It will be appreciated that many variations of the edge detector logic circuit 250 may be available in accordance with an example embodiment of the invention. For example, the XOR logic circuit 201 may be implemented using a combination of AND gates and OR gates, according to example embodiment of the invention.

Figure 3:
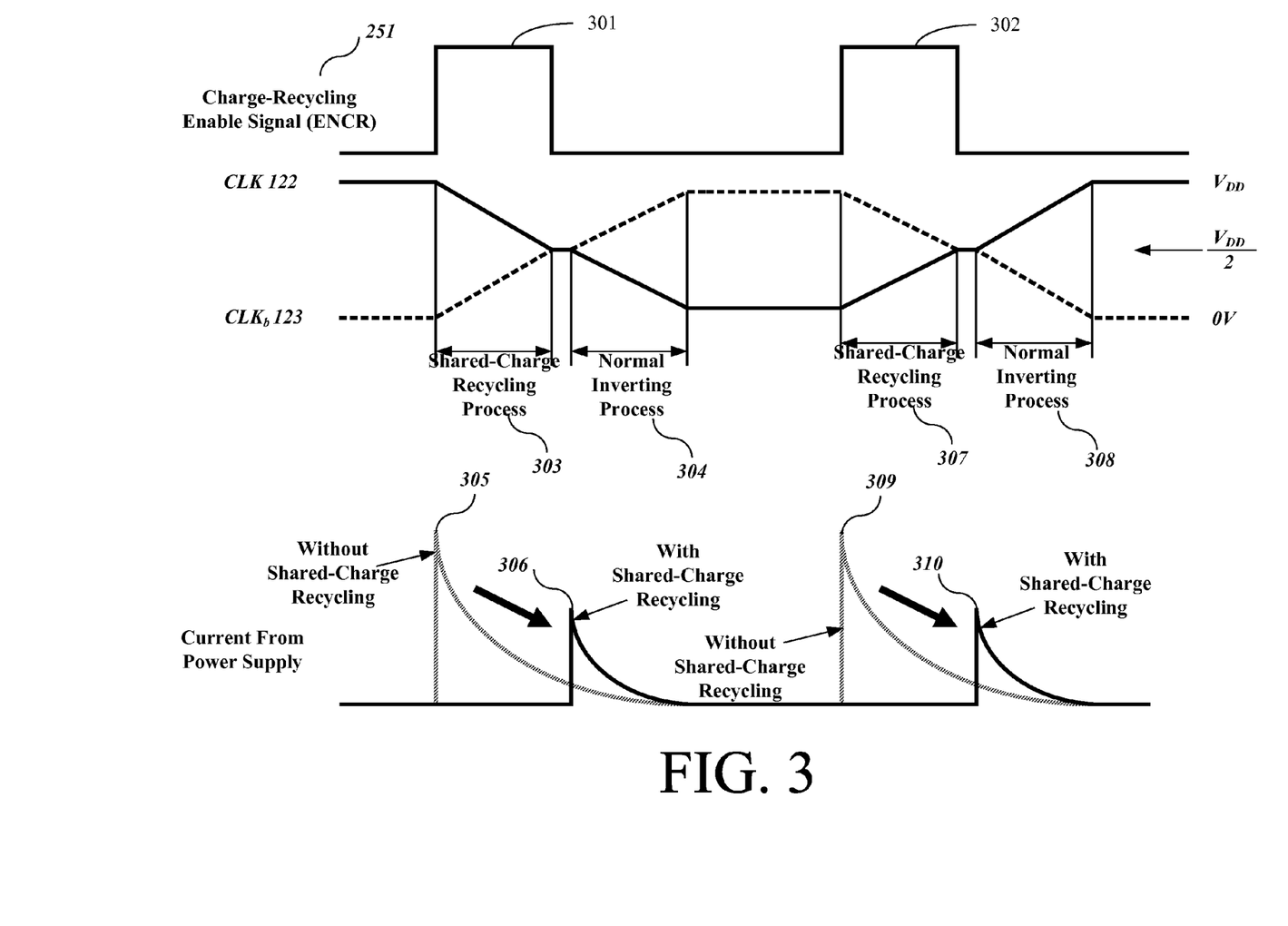
FIG. 3 provides example diagrams illustrating an operation of an example shared-charge recycling process, according to an example embodiment of the invention.

The operation of an example clock buffer 102 to provide for example shared-charge recycling in the charge transfer cells 103 will be discussed in conjunction with the example diagrams of FIG. 3. With reference to FIG. 3, the edge detector logic circuit 250 can generate a charge-recycling enable signal 251 (ENCR) (e.g., a control signal) that includes a pulse associated with a detected edge of the reference clock signal 121 ($V_{OSC}$). If a complementary charge-recycling enable signal 252 (ENCRb) (e.g., a complementary control signal) is being utilized, then the signal 252 may be the inverse of the signal 251, according to an example embodiments of the invention.

Each pulse (e.g., pulses 122, 123, etc.) of the charge-recycling enable signal 251 (ENCR) (and optionally, complementary charge-recycling enable signal 252 (ENCRb)) may enable charge-recycling, which may result in disabling the tristate inverters 205, 206 while enabling the transmission-gate switch 207, according to an example embodiment of the invention. By disabling the tristate inverters 205, 206, a respective high impedance is provided at the respective outputs of the tristate inverters 205, 206, which effectively disconnects the tristate inverters 205, 206 from the output nodes 208, 209. At the same time, the transmission-gate switch 207 may be turned on by the charge-recycling enable signals (ENCR and/or ENCRb), thereby connecting the output nodes 208 and 209. Since the output nodes 208 and 209 of the clock buffer 102 are connected to the charge transfer cells 103, the capacitors 210 (CP$_1$) and 211 (CP$_2$) in the charge transfer cells 103 may be connected together by the enabled (e.g., turned on) transmission-gate switch 207. Since the clock signal 123 (CLK$_b$) is the inverse of the clock signal 122 (CLK), the charges stored in capacitor 210 (CP$_1$), for example, may be moved or discharged to the capacitor 211 (CP$_2$) when the first clock signal 122 (CLK) is high and the second clock signal 123 (CLK$_b$) is low, as illustrated for the first shared-charge recycling process 303 during the first pulse 122. As the charges are moved or discharged from capacitor 210 (CP$_O$) to capacitor 211 (CP$_2$), the voltage of the first clock signal 122 (CLK) may be reduced from V$_{DD}$ to a lower voltage, perhaps V$_{DD}$/2, while the voltage of the second clock signal 123 (CLK$_b$) may increase from 0V to a higher voltage, perhaps V$_{DD}$/2. In some example embodiments, the sharing of the charges from capacitor 210 (CP$_O$) to capacitor 211 (CP$_2$) may equalize the voltages of the clock signals 122 (CLK) and 123 (CLK$_b$), perhaps to be at half the power-supply voltage V$_{DD}$. It will be appreciated that it may be necessary to disable the tristate inverters 205, 206 in order to provide the high impedance that disconnects the clock buffer 102 from the capacitors 210, 211 to prevent current leakage through the clock buffer 102 when the capacitors 210, 211 are connected via the closed transmission-gate switch 207.

After the shared-charge recycling process 303, which coincides with the falling edge of the pulse 301, the tristate inverters 205, 206 may be enabled while the transmission-gate switch 207 may be disabled (e.g., turned off). In the normal inverting process 304, the charges stored in capacitor 210 (CP$_1$) may now be discharged to ground (using CLK 122), thereby taking the first clock signal 122 (CLK) to 0V. On the other hand, the capacitor 211 (CP$_2$) may be fully charged by the power supply, thereby making the second clock signal 123 (CLK$_b$) the same as the power-supply voltage V$_{DD}$. However, since the shared-charge recycling process 303 had increased the second clock signal 123 (CLK$_b$) from 0V to a higher voltage, perhaps V$_{DD}$/2, by the start of the normal inverting process 304 such that the process 304 only needed less than the power-supply voltage V$_{DD}$, perhaps only half of the power-supply voltage V$_{DD}$, to be charged by the current from the power supply (using CLKb 123) in order to fully charge the capacitor 211 (CP$_2$) to the power-supply voltage V$_{DD}$. As shown in FIG. 3, during an example shared-charge recycling process 303, no current is drawn from the power supply with the shared-charge recycling process 303 while a current 305 is drawn if the shared-charge recycling process 303 is not being utilized. Then, during the normal inverting process 304 following the shared-charge recycling process 303, a smaller current 306 is drawn from the power supply in order to charge the capacitor 211 (CP$_2$) to the power-supply voltage V$_{DD}$. In an example embodiment of the invention, the current 306 from the power supply with the shared-charge recycling can be reduced by about 50% compared to the current 305 drawn without the shared-charge recycling process 303. For example, the amount of current saving can be calculated by the following equation:

$$I_{saving} = n \times \frac{1}{2} f C V_{DD} (1 - e^{-2t/RCP_2}) - I_{logic},$$

where n is the number of charge transfer cells 103, f is the reference clock frequency, C is the total parasitic capacitance of capacitors 210 (CP$_1$) or 211 (CP$_2$), t is the charge-recycling time (e.g., based upon the pulse width of ENCR), R is the on-resistance of the transmission-gate switch 207, and I$_{logic}$ is the current consumed by the edge detector logic circuit 250.

Similarly, during the second pulse 302 of the charge-recycling enable signal 251 (ENCR), the shared-charge recycling process 307 may be enabled. During the shared-charge recycling process 307, the tristate inverters 205, 206 may be disabled and the transmission-gate switch 207 may be enabled. Thus, the outputs of the tristate inverters 205, 206 may be high impedance, while the nodes 208, 209 are connected by the turned-on transmission-gate switch 207. Since the second clock signal 123 (CLK$_b$) may be higher than the first clock signal 122 (CLK), the stored charge in capacitor 211 (CP$_2$) may be moved or discharged to the capacitor 210 (CP$_1$). As the charges are moved or discharged from capacitor 211 (CP$_2$) to capacitor 210 (CP$_1$), the voltage of the second clock signal 123 (CLK$_b$) may be reduced from V$_{DD}$ to a lower voltage, perhaps V$_{DD}$/2, while the voltage of the first clock signal 122 (CLK) may increase from 0V to a higher voltage, perhaps V$_{DD}$/2. Thus, in some embodiments, the sharing of the charges from capacitor 211 (CP$_2$) to capacitor 210 (CP$_1$) may equalize the voltages of the clock signals 122 (CLK) and 123 (CLK$_b$), perhaps to be at half the power-supply voltage V$_{DD}$. After the shared-charge recycling process 307, which coincides with the falling edge of the pulse 302, the tristate inverters 205, 206 may be enabled while the transmission-gate switch 207 may be disabled (e.g., turned off). In the normal inverting process 308, the charges stored in capacitor 211 (CP$_2$) may now be discharged to ground, thereby taking the second clock signal 123 (CLK$_b$) to 0V. On the other hand, the capacitor 210 (CP$_1$) may be fully charged by the power supply, thereby making the first clock signal 122 (CLK) the same as the power supply V$_{DD}$. However, since the shared-charge recycling process 307 had increased the first clock signal 122 (CLK) from 0V to higher voltage, perhaps V$_{DD}$/2, by the start of the normal inverting process 308, the normal inverting process 308 only needed less than the power-supply voltage V$_{DD}$, perhaps only half of the power-supply voltage V$_{DD}$, to be charged by the current from the power supply in order to fully charge the capacitor 210 (CP$_1$) to the power-supply voltage V$_{DD}$. As shown in FIG. 3, during the shared-charge recycling process 307, no current is drawn from the power supply with the shared-charge recycling process 307, while a current 309 is drawn if the shared-charge recycling process 307 is not being utilized. Instead, during the normal inverting process 308 following the shared-charge recycling process 307, a smaller current 310 is drawn from the power supply in order to charge the capacitor 210 (CP$_1$) to the power-supply voltage V$_{DD}$ (using CLK 122). In an example embodiment of the invention, the current 310 from the power supply with the shared-charge recycling 307 can be reduced by about 50% compared to the current 309 drawn without the shared-charge recycling process 307.

Figure 4:
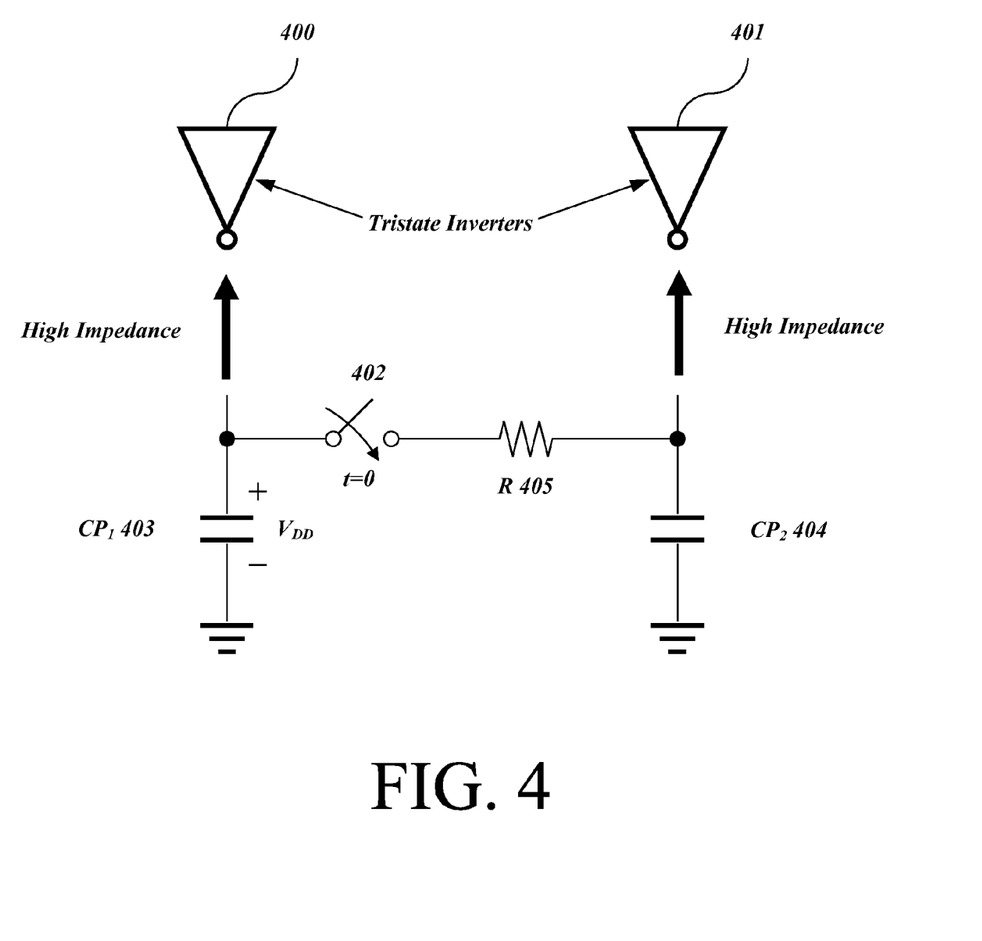
FIG. 4 illustrates an example network that is formed between a clock buffer and charge transfer cells during a shared-charge recycling process, according to an example embodiment of the invention.
Figure 9:
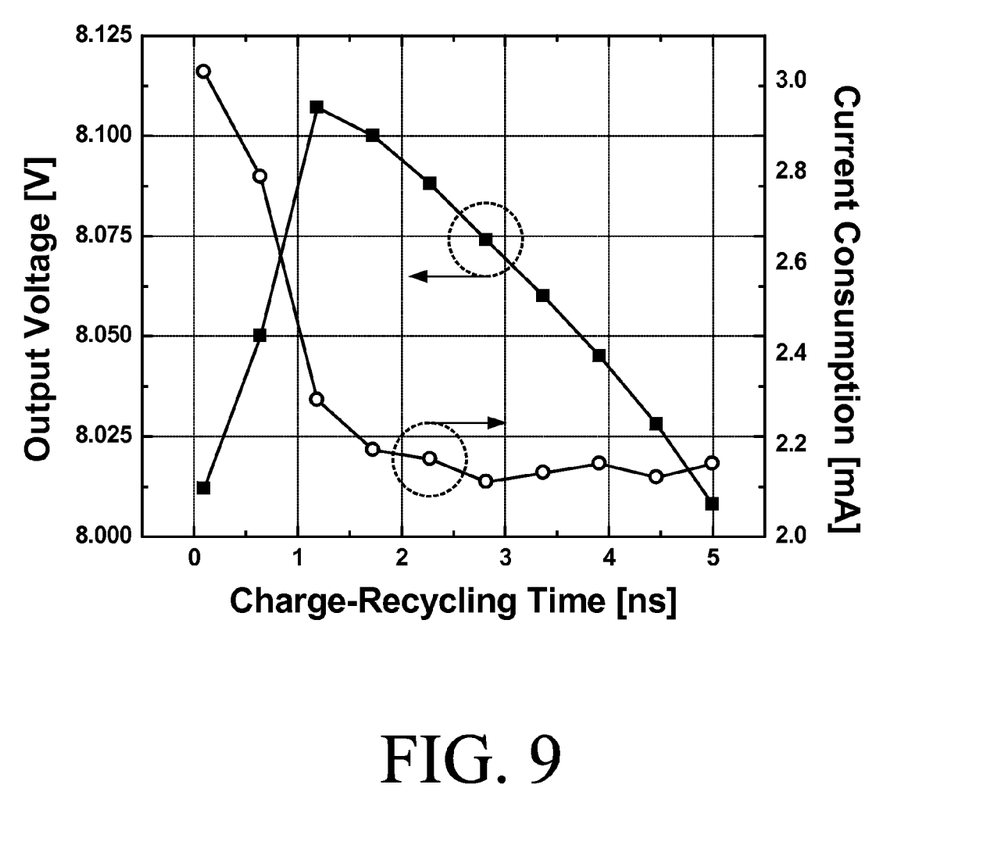
FIG. 9 illustrates example simulation results for the determination of the charge-recycling time based upon consideration of the amount of current saved and the output voltage, according to an example embodiment of the invention.

FIG. 4 illustrates an example equivalent network that is formed between a clock buffer and charge transfer cells during a shared-charge recycling process, according to an example embodiment of the invention. More specifically, FIG. 4 illustrates the output of the tristate inverters 400, 401 (of an example clock buffer) and the capacitors 403 (CP$_O$) and 404 (CP$_2$) (of example charge transfer cells) during a shared-charge recycling process. At the beginning (e.g., t=0) of the shared-charge recycling process, the tristate inverters 400, 401 may be disabled, and the transmission-gate switch 402 may be turned on (e.g., closed). As such, the output of the tristate inverters 400, 401 may have high impedance, and thus, be effectively disconnected from capacitors 403 (CP$_1$), 404 (CP$_2$) (e.g., which may be respective parasitic capacitances of respective charge transfer cells). However, because the transmission-gate switch 402 is closed, there is an RC network formed by capacitors 403 (CP$_1$), 404 (CP$_2$), and any resistor R 405. Since the initial voltage across capacitor 403 (CP$_1$) is V$_{DD}$ (assuming the first clock signal CLK is high at time t=0) and that across capacitor 404 (CP$_2$) is 0V (assuming the second clock signal CLK$_b$ is low at time t=0), the charges may be moved or discharged from capacitor 403 (CP$_O$) to capacitor 404 (CP$_2$). The voltage across 403 (CP$_1$) is decreased while the voltage across capacitor 404 (CP$_2$) is increased. The voltage across capacitor 404 (CP$_2$) after a time t can be determined by the following equation:

$$V(t) = \frac{V_{DD}}{2}(1 - e^{-2t/RCP_1}),$$

where R is the resistance of resistor 405, CP$_1$ is the capacitance of capacitor 403 (CP$_1$). If the time t is long enough so that the voltage across capacitor 404 (CP$_2$) becomes as high as half of V$_{DD}$, the amount of current saved may be maximized because only half of V$_{DD}$ may need to be charged by the power supply during the normal inverting process. However, if the time t is not long enough, then the voltage across capacitor 404 (CP$_2$) may be less than half of V$_{DD}$, and more than half of V$_{DD}$ may then need to be charged by the power supply during the normal inverting process, thereby requiring more current than optimal and diminishing the complete benefits of shared-charge recycling. On the other hand, when the time t is too long, then it may take longer for the clock signals to reach V$_{DD}$ or 0V, which may result in a reduced output voltage level in magnitude without additional current saved. For example, when the reference clock frequency is 30 MHz, the output voltage is over 8.1 V with the shared-charge recycling time of 1.2 ns, but the output voltage may be reduced to be less than 8.02 V with the shared-charge recycling time of 5 ns. As such, it may be desirable to configure the shared-charge recycling time considering the reference clock frequency. The desired shared-charge recycling time can be used to adjust the delay provided by delay module 200 in order to create an appropriate pulse width for the charge-recycling enable signal (ENCR) (or alternatively for complementary charge-recycling enable signal (ENCR$_b$), according to an example embodiment of the invention. FIG. 9 illustrates example simulation results for the determination of the charge-recycling time based upon considerations of the amount of current saved and the output voltage, according to an example embodiment of the invention. With the reference clock frequency of 30 MHz, the charge-recycling time can be approximately 1.2 ns. If the time is shorter than 1.2 ns, the current saving amount is lowered compared to the case with 1.2-ns charge-recycling time. If the time is longer than 1.2 ns, however, the output voltage is decreased, according to an example embodiment of the invention.

Figure 5A:
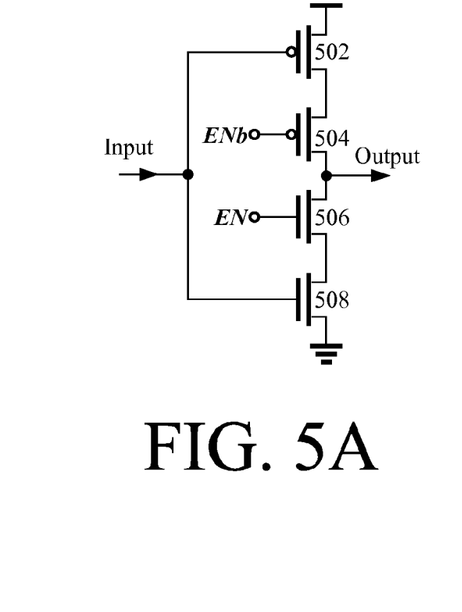
FIGS. 5A-5C illustrate example implementations of tristate inverters, according to example embodiments of the invention.
Figure 5B:
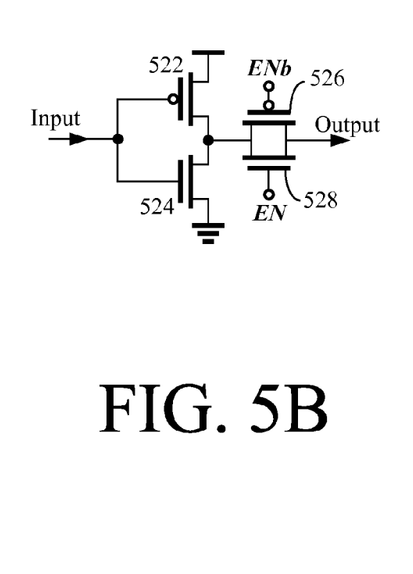
Figure 5C:
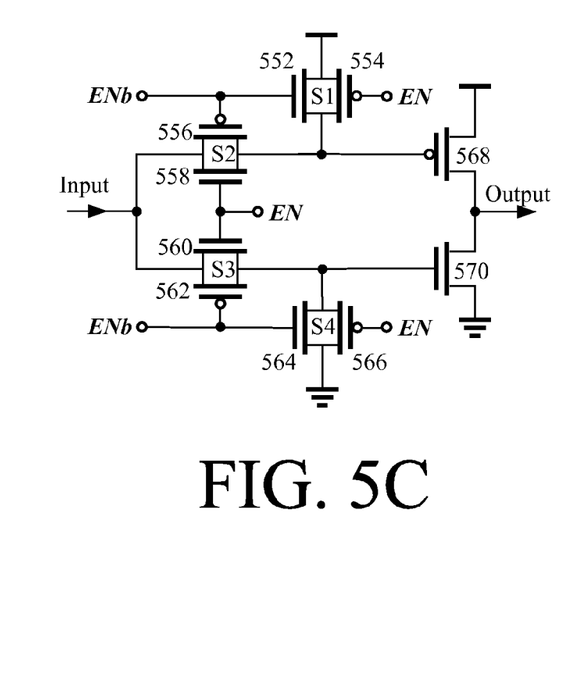

FIGS. 5A-5C illustrate example implementations for tristate inverters, according to an example embodiment of the invention. One or more of the tristate inverters in FIGS. 5A-5C may be utilized to realize one or more of the tristate inverters 205, 206 in FIG. 2 (or tristate inverters 400, 401 in FIG. 4), according to an example embodiment of the invention.

FIG. 5A illustrates a first example tristate inverter that includes PMOS transistors 502, 504 and NMOS transistors 506, 508. In the configuration of FIG. 5A, the source of PMOS transistor 502 may be connected to a source voltage (e.g., power-supply voltage), while the drain of transistor 502 may be connected to the source of PMOS transistor 504. Likewise, the drain of PMOS transistor 504 may be connected to the drain of NMOS transistor 506. The source of transistor 506 may be connected to the drain of NMOS transistor 508. The source of transistor 508 may be connected to a reference voltage, which may be ground, according to an example embodiment of the invention. The gates of transistors 502, 508 may be commonly connected to the input of the tristate inverter. The output of the tristate inverter may be provided at a node between the drains of transistors 504, 506. The gate of NMOS transistor 506 may provide the Enable (EN) port while the gate of PMOS transistor 504 may provide the complementary Enable (EN$_b$) port. In operation, when the EN port=high (1) and the EN$_b$ port=low (0), the tristate inverter may be enabled such that it generates an output that is the inverse of the input. On the other hand, when the EN port=low (0) and the EN$_b$ port=high (1), then the tristate inverter may be disabled, such that there is a high impedance at the output, thereby providing isolation between the input and the output. Since the charge-recycling enable signal 251 (ENCR) generates a pulse when the tristate inverter needs to be disabled, the charge-recycling enable signal 251 (ENCR) may be provided to the EN port, while the complementary charge-recycling enable signal 252 (ENCR$_b$) may be provided to the complementary EN$_b$ port, according to an example embodiment of the invention.

FIG. 5B illustrates a second example tristate inverter that includes PMOS transistors 522, 526 and NMOS transistors 524, 528. In FIG. 5B, the source of PMOS transistor 522 may be connected to a source voltage, while the drain of transistor 522 may be connected to the drain of the NMOS transistor 524. The source of the transistor 524 may be connected to a reference voltage, which may be ground, according to an example embodiment of the invention. The gates of the PMOS transistor 522 and the NMOS transistor 524 may be commonly connected to the input of the tristate inverter. The inverted output at a node between the drains of transistors 522, 524 may be provided as an input to a transmission-gate switch. More specifically, the transmission gate switch may include a PMOS transistor 526 in parallel with an NMOS transistor 528 such that their respective drains and sources are connected together. The gate of NMOS transistor 528 may provide the Enable (EN) port while the gate of PMOS transistor 526 may provide the complementary Enable (EN$_b$) port. In operation, when the EN port=high (1) and the EN$_b$ port=low (0), the tristate inverter may be enabled such that it passes the output that is the inverted output from transistors 522, 524. On the other hand, when the EN port=low (0) and the EN$_b$ port=high (1), then the tristate inverter may be disabled such that there is a high impedance at the output, thereby providing isolation between the input and the output. Since the charge-recycling enable signal 251 (ENCR) generates a pulse when the tristate inverter needs to be disabled, the charge-recycling enable signal 251 (ENCR) may be provided to the EN port, while the complementary charge-recycling enable signal 252 (ENCR$_b$) may be provided to the complementary EN$_b$ port, according to an example embodiment of the invention.

FIG. 5C illustrates a third example tristate inverter, according to an example embodiment of the invention. The third tristate inverter can include PMOS transistors 554, 556, 562, 566, 568, as well as NMOS transistors 552, 558, 560, 564, 570. The source of PMOS transistor 568 may be connected to a source voltage, while the drain of transistor 568 may be connected to the drain of the NMOS transistor 570. The source of the transistor 570 may be connected to a reference voltage, which may be ground, according to an example embodiment of the invention. Transistors 552, 554 may form a first transmission-gate switch S1; transistors 556, 558 may form a second transmission-gate switch S2; transistors 560, 562 may form a third transmission-gate switch S3; and transistors 564, 566 may form a fourth transmission-gate switch S4. The gate of the PMOS transistor 568 may be connected or disconnected from the input of the tristate inverter via the transmission-gate switch S2. Likewise, the gate of the NMOS transistor 570 may be connected or disconnected from the input of the tristate inverter via the transmission-gate switch S3. Transmission-gate switch S1 can be used to connect or disconnect the gate of PMOS transistor 568 from a source voltage. Likewise, the transmission-gate switch S4 can be used to connect or disconnect the gate of NMOS transistor 570 from a reference voltage such as ground. In operation, when the EN port=high (1) and the $EN_b$ port=low (0), the tristate inverter may be enabled such that it passes the output that is the inverted output from transistors 568, 570. Accordingly, transmission-gate switches S2, S3 may allow the respective signals to pass, while transmission-gate switches S1, S4 will be disabled to provide isolation. On the other hand, when the EN port=low (0) and the $EN_b$ port=high (1), then the tristate inverter will be disabled, such that there is a high impedance at the output, thereby providing isolation between the input and the output. In this situation, the transmission-gate switches S2, S3 will be disabled to not allow the input signal to pass. On the other hand, transmission-gate switch S1 may be enabled to connect the gate of PMOS transistor 568 to a power source, thereby reducing leakage current to the tristate inverter output and further increasing the breakdown voltage of the transistor 568. Likewise, transmission-gate switch S4 will be enabled to connect the gate of NMOS transistor 570 to a reference voltage such as ground, thereby reducing leakage current to the tristate inverter output and further increasing the breakdown voltage of the transistor 568.

Figure 6A:
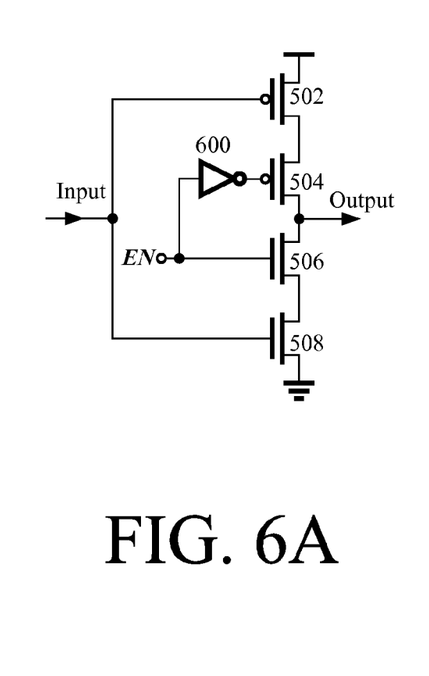
FIGS. 6A-6C illustrate alternative implementations of the tristate inverters of FIGS. 5A-5C, according to example embodiments of the invention.
Figure 6B:
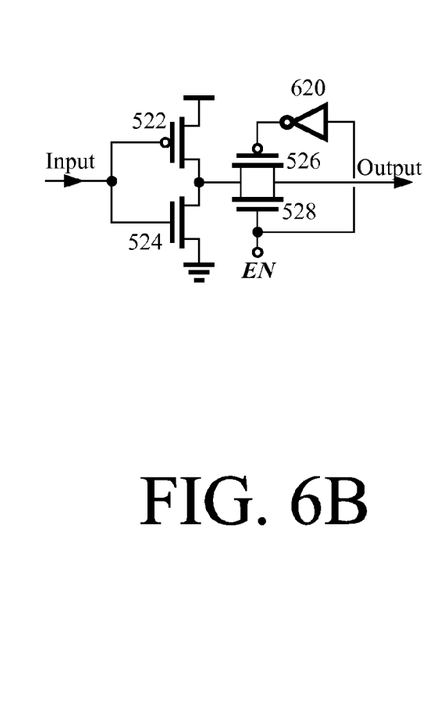
Figure 6C:
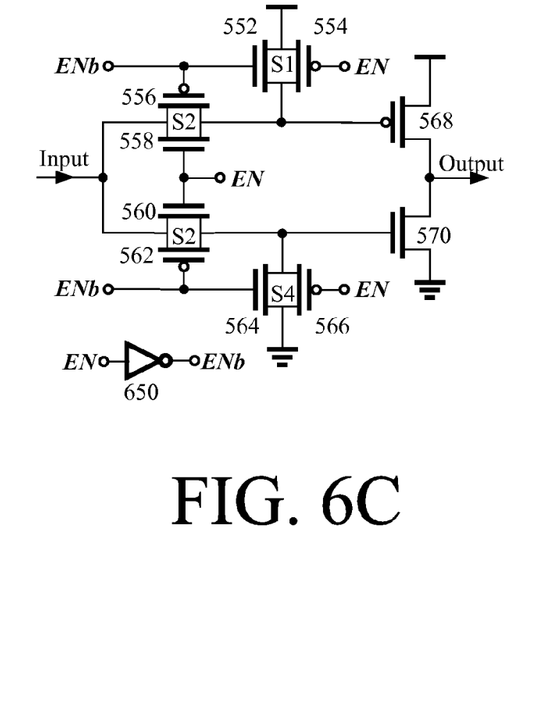

It will be appreciated that many variations of the tristate inverters of FIGS. 5A-5C are available. For example, FIGS. 6A-6C illustrate variations of the tristate inverters where only a single enable signal (EN) needs to be provided without a need to provide a separate complementary enable signal ($EN_b$). In FIG. 6A, an inverter 600 may be provided to convert the received enable signal (EN) to an internal complementary enable signal ($EN_b$). Similarly, FIG. 6B includes an inverter 620 to convert the received enable signal (EN) to an internal complementary enable signal ($EN_b$). Finally, FIG. 6C illustrates an inverter 650 used to convert the received enable signal (EN) to an internal complementary enable signal ($EN_b$). Accordingly, it will be appreciated that many variations of FIGS. 5A-5C and 6A-6C are available without departing from example embodiments of the invention.

Example Measurement Results

Figure 7:
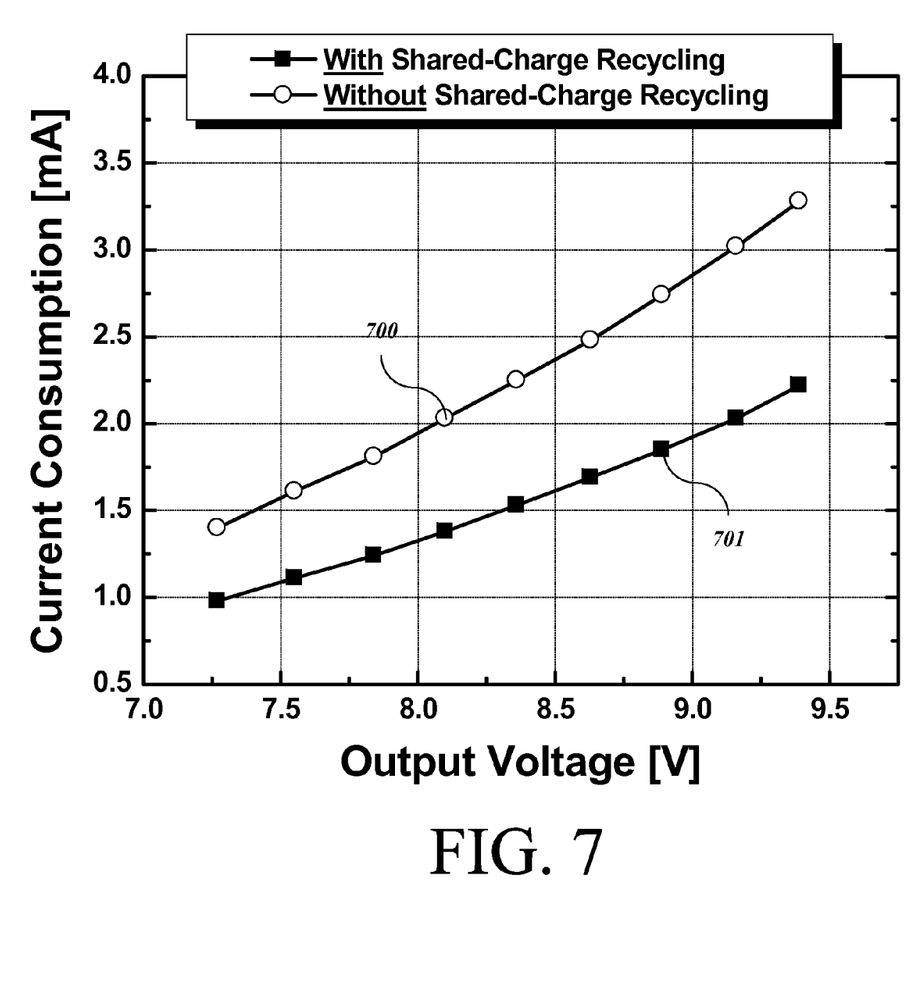
FIG. 7 illustrates example measurement results for the operation of an example shared-charge recycling process in accordance with an embodiment of the invention.
Figure 8:
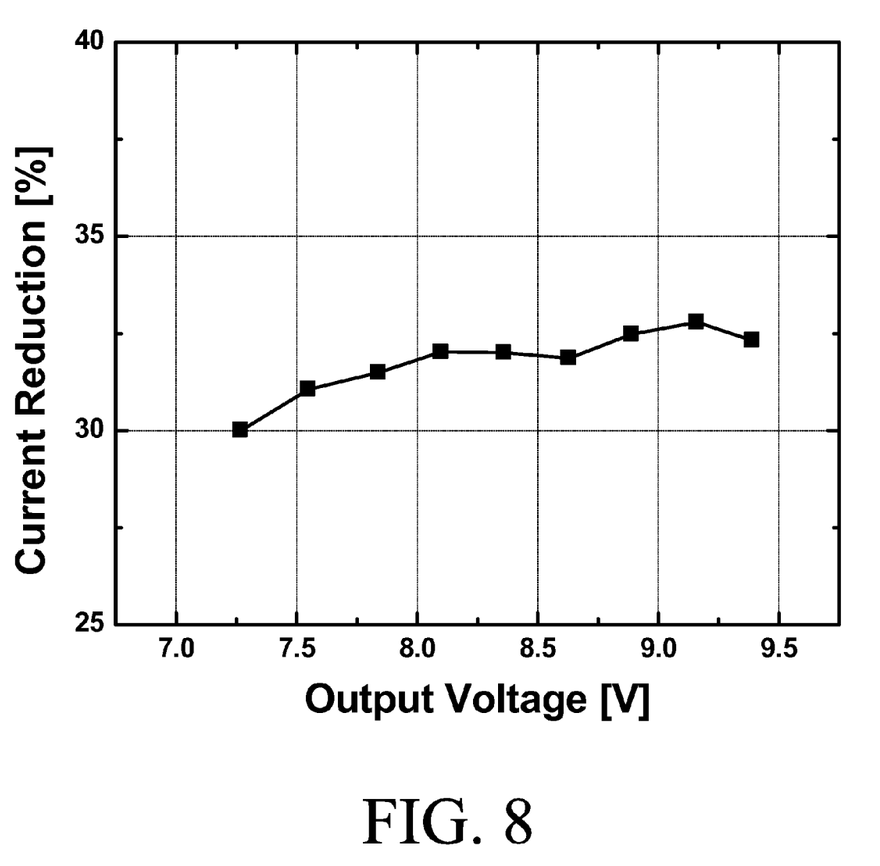
FIG. 8 illustrates the percentage of the amount of reduced current that is realized based upon an example shared-charge recycling process, according to an example embodiment of the invention.

FIG. 7 illustrates example measurement results for the operation of an example shared-charge recycling process in accordance with an embodiment of the invention. These measurement results illustrate the current reduction obtained by using the shared-charge recycling technique. FIG. 7 illustrates the current consumption 701 of the antenna-switch driver with an example shared-charge recycling process and the current consumption 700 without the shared-charge recycling process 700. As shown by FIG. 7, the current consumption 701 utilizing the shared-charge recycling process may be reduced compared to the current consumption 700. FIG. 8 illustrates the percentage of the amount of reduced current that is realized based upon an example shared-charge recycling process, according to an example embodiment of the invention.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A CMOS driver circuit, comprising:
   a first tristate inverter that provides a first clock signal along a first signal path;
   a second tristate inverter that provides a second clock signal along a second signal path, the first clock signal and the second clock signal being out of phase;
   at least one first capacitor that receives the first clock signal in the first signal path;
   at least one second capacitor that receives the second clock signal in the second signal path;
   a switch configured between the first signal path and the second signal path, wherein the switch is closed to connect the first and second signal paths, and opened to isolate the first and second signal paths,
   wherein during a stored-charge recycling process, the first and second tristate inverters are disabled and the switch is closed, thereby allowing stored charges to be transferred either (i) from the at least one first capacitor to the at least one second capacitor, or (ii) from the at least one second capacitor to the at least one first capacitor.

2. The CMOS driver circuit of claim 1, wherein when the first and second tristate inverters are disabled, the respective outputs of the first and second tristate inverters are provided a respective high impedance, thereby decoupling the first and second tristate inverters from the respective first and second signal paths.

3. The CMOS driver circuit of claim 1, wherein the switch is a transmission-gate switch formed by a parallel combination of an NMOS transistor and a PMOS transistor.

4. The CMOS driver circuit of claim 1, wherein the respective inputs to the first and second tristate inverters are derived from a reference clock signal from an oscillator, and further comprising:
   an edge detector logic circuit that generates a pulse in response to detecting an edge of the reference clock signal, wherein the generated pulse serves as a control signal for controlling the first and second tristate inverters and the switch.

5. The CMOS driver circuit of claim 1, further comprising:
   at least one first inverter, wherein the at least one first inverter receives a reference clock signal and outputs a first signal that is utilized as an input to the first tristate inverter;
   a second set of inverters, wherein the second set of inverters receives the reference clock signal and outputs a second signal that is utilized as an input to the second tristate inverter.

6. The CMOS driver circuit of claim 5, wherein the reference clock signal is provided by an oscillator.

7. The CMOS driver circuit of claim 1, wherein the at least one first capacitor is at least one first parasitic capacitance of a first charge transfer cell, and wherein the at least one second capacitor is a second parasitic capacitance of a second charge transfer cell.

8. The CMOS driver circuit of claim 1, wherein the at least one first capacitor and the at least one second capacitor are part of a set of charge transfer cells, wherein the charge transfer cells collectively provide an output having a negative voltage or high voltage, wherein the high voltage is greater than a supply voltage associated with the first and second clock signals.

9. The CMOS driver circuit of claim 8, wherein the output of the charge transfer cells is provided as an input to a level shifter, wherein the level shifter provides a high voltage, negative voltage, or zero voltage, based at least in part on a control signal received from a decoder.

10. The CMOS driver circuit of claim 1, wherein the transferred stored charges are about half of a power-supply voltage.

11. The CMOS driver circuit of claim 1, wherein the switch is a transmission-gate switch comprising a parallel combination of a PMOS transistor and an NMOS transistor.

12. A method comprising:
providing a first tristate inverter that provides a first clock signal along a first signal path;
providing a second tristate inverter that provides a second clock signal along a second signal path, the first clock signal and the second clock signal being out of phase;
configuring at least one first capacitor to receive the first clock signal in the first signal path;
configuring one second capacitor to receive the second clock signal in the second signal path;
providing a switch between the first signal path and the second signal path, wherein the switch is closed to connect the first and second signal paths, and opened to isolate the first and second signal paths,
wherein during a stored-charge recycling process, the first and second tristate inverters are disabled and the switch is closed, thereby allowing stored charges to be transferred either (i) from the at least one first capacitor to the at least one second capacitor, or (ii) from the at least one second capacitor to the at least one first capacitor.

13. The method of claim 12, wherein when the first and second tristate inverters are disabled, the respective outputs of the first and second tristate inverters are provided a respective high impedance, thereby decoupling the first and second tristate inverters from the respective first and second signal paths.

14. The method of claim 12, wherein the switch is a transmission-gate switch formed by a parallel combination of an NMOS transistor and a PMOS transistor.

15. The method of claim 12, wherein the respective inputs to the first and second tristate inverters are derived from a reference clock signal from an oscillator, and further comprising:
generating, by an edge detector logic circuit, a pulse in response to detecting an edge of the reference clock signal, wherein the generated pulse serves as a control signal for controlling the first and second tristate inverters and the switch.

16. The method of claim 12, further comprising:
providing at least one first inverter, wherein the at least one first inverter receives a reference clock signal and outputs a first signal that is utilized as an input to the first tristate inverter;
providing a second set of inverters, wherein the second set of inverters receives the reference clock signal and outputs a second signal that is utilized as an input to the second tristate inverter.

17. The method of claim 12, wherein the at least one first capacitor is at least one first parasitic capacitance of a first charge transfer cell, and wherein the at least one second capacitor is a second parasitic capacitance of a second charge transfer cell.

18. The method of claim 12, wherein the at least one first capacitor and the at least one second capacitor are part of a set of charge transfer cells, wherein the charge transfer cells collectively provide an output having a negative voltage or high voltage, wherein the high voltage is greater than a supply voltage associated with the first and second clock signals.

19. The method of claim 18, wherein the output of the charge transfer cells is provided as an input to a level shifter, wherein the level shifter provides a high voltage, negative voltage, or zero voltage, based at least in part on a control signal received from a decoder.

20. The method of claim 18, wherein the transferred stored charges are about half of a power-supply voltage.

* * * * *